(12) United States Patent
Sharfi (10) Patent No.: US 11,825,624 B2
(45) Date of Patent: Nov. 21, 2023

(54) RUGGED UTILITY ULTRA SLIM SELF-LOCKING EJECTOR DEVICE

(71) Applicant: Benjamin K. Sharfi, Rancho Cucamonga, CA (US)

(72) Inventor: Benjamin K. Sharfi, Rancho Cucamonga, CA (US)

(73) Assignee: Benjamin K. Sharfi, Rancho Cucamonga, CA (US)

( * ) Notice: Subject to any disclaimer, the term of this patent is extended or adjusted under 35 U.S.C. 154(b) by 0 days.

(21) Appl. No.: 17/934,059

(22) Filed: Sep. 21, 2022

(65) Prior Publication Data

US 2023/0099556 A1 Mar. 30, 2023

Related U.S. Application Data

(60) Provisional application No. 63/246,502, filed on Sep. 21, 2021.

(51) Int. Cl.
*G06F 1/16* (2006.01)
*H05K 5/00* (2006.01)
(Continued)

(52) U.S. Cl.
CPC ......... *H05K 7/1405* (2013.01); *H05K 7/1409* (2013.01)

(58) Field of Classification Search
CPC .. H05K 7/1405; H05K 7/1404; H05K 7/1407; H05K 7/1408; H05K 7/1409;
(Continued)

(56) References Cited

U.S. PATENT DOCUMENTS

| 5,414,594 A | * | 5/1995 | Hristake | H05K 7/1409 439/153 |
| 6,373,713 B1 | * | 4/2002 | Jensen | H05K 7/1409 439/153 |

(Continued)

OTHER PUBLICATIONS

International Application No. PCT/US22/76792—Patent Cooperation Treaty PCT International Search Report—Completed Dec. 21, 2022 (dated Jan. 19, 2023).

(Continued)

*Primary Examiner* — Anthony M Haughton
(74) *Attorney, Agent, or Firm* — Lott & Fischer, PL (57) ABSTRACT

An ejector device comprising a housing block; an ejector handle adapted to alternate between an open position and a closed position, having first and second rack engagement features, a sloped feature, and a notch; a trigger latch adapted to alternate between a latched position and an unlatched position, and having a sloped feature adapted to engage the sloped handle feature, and a hook adapted to engage the ejector handle notch; and an ejector button adapted to alternate between a pressed position and an unpressed position; wherein the housing block comprises a space for receiving the ejector handle and the latching trigger; the ejector handle is pivotally attached to the housing block and is adapted to urge the latching trigger to the unlatched position when the ejector handle moves to the closed position and the sloped handle feature engages with the sloped latching trigger feature; and the latching trigger is pivotally attached to the housing block, and is adapted to be urged to the unlatched position as the ejector button moves to the pressed position and impinges on the latching trigger.

3 Claims, 8 Drawing Sheets

(51) Int. Cl.
*H05K 7/00* (2006.01)
*H05K 7/14* (2006.01)

(58) Field of Classification Search
CPC .... H05K 7/1402; H05K 7/1401; G06F 1/183; G06F 1/185; G06F 1/186; G06F 1/187
See application file for complete search history.

(56) References Cited

U.S. PATENT DOCUMENTS

| | | | |
|---|---|---|---|
| 6,762,934 B2 | 7/2004 | Kitchen et al. | |
| 7,264,490 B1* | 9/2007 | Reznikov | H01R 13/62933 439/152 |
| 8,611,103 B2 | 12/2013 | Thomas et al. | |
| 8,749,966 B1* | 6/2014 | Boudreau | G11B 33/128 361/679.33 |
| 10,396,497 B1* | 8/2019 | Bame | H01R 13/62938 |
| 11,489,274 B2* | 11/2022 | Wang | H05K 7/1489 |
| 2003/0172523 A1* | 9/2003 | Joist | H05K 7/1409 29/758 |
| 2005/0136715 A1* | 6/2005 | Schlack | H05K 7/1409 439/160 |
| 2013/0130528 A1* | 5/2013 | Jun | H05K 7/1409 439/160 |
| 2014/0187068 A1* | 7/2014 | Chia | H01R 13/62933 439/160 |
| 2015/0074992 A1* | 3/2015 | Chen | H05K 7/1409 29/764 |

OTHER PUBLICATIONS

International Application No. PCT/US22/76792—Patent Cooperation Treaty PCT Written Opinion of the International Searching Authority—Completed Dec. 21, 2022 (dated Jan. 19, 2023).

* cited by examiner

RUGGED UTILITY ULTRA SLIM SELF-LOCKING EJECTOR DEVICE

CLAIM OF PRIORITY

This application is being filed as a non-provisional patent application under 35 U.S.C. § 111(a) and 37 CFR § 1.53(b). This application claims priority under 35 U.S.C. § 119(e) to U.S. provisional patent application Ser. No. 63/246,502 filed on Sep. 21, 2021, the contents of which are incorporated herein by reference.

FIELD OF INVENTION

The present invention relates to computer and electronic device mounts, racks, and the like. More specifically, the present invention relates to a novel self-locking ejector device for use in conjunction with computer and electronic equipment mounts and racks and similar equipment.

SUMMARY OF THE INVENTION

Disclosed is a very low-profile self-locking ejector device for use, inter alia, in electronic equipment mounting installations. The disclosed device is used to assist in the insertion, locking in place, and removal (i.e., ejection,) of electronic equipment on to and from electronics mounting trays, racks, shelves, and the like. In comparison with devices in the prior art, the disclosed device provides a slimmer, more rugged, lighter weight, and more versatile self-locking solution.

The disclosed device is flight-worthy and rugged with a broad range of shock, vibration, and temperature (−40° C. to +85° C.) capabilities. Specifically, it can be utilized, for example and not by way of limitation, in removeable bay, servers, routers, switches, and PCIe cartridge to retain and secure an electronic card device.

The device primarily comprises a housing block, an ejector handle, an ejector button, and a latching trigger. The handle is secured to the housing by means of a pivoting spring mechanism which is biased to the open position. The latching trigger is secured to the housing by a pivoting spring mechanism. The latching trigger is adapted to engage a notch on the handle when the assembly is in the closed position, and to disengage the handle when the button is actuated to abut with the trigger. The button is secured to the housing by means of a screw and a spring which biases the button to the non-actuated position. The ejector overall width is less than 0.25-inch and it fits in very small spaces. The material can be made of aluminum and other materials with anodization for anti-corrosion and durability.

DETAILED DESCRIPTION OF THE INVENTION

Following are detailed descriptions of several aspects of the present invention, all of which relate to a low-profile self-locking ejector device for use in electronic equipment mounting installations.

Figure 1:
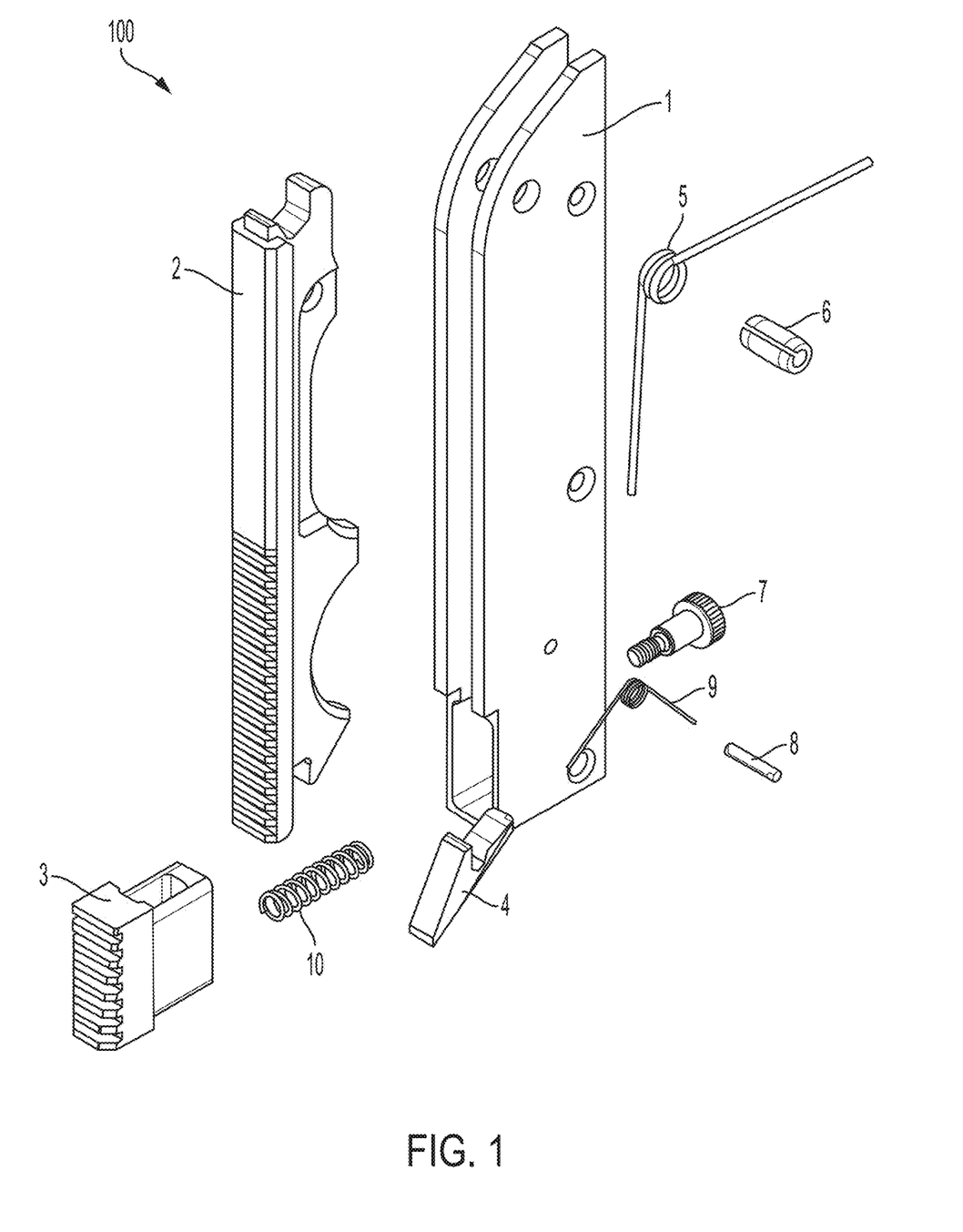
FIG. 1 shows an orthogonal exploded view of the ejector device of the present invention.

As shown on FIG. 1, the main components of the ejector device (100) are a housing block (1), an ejector handle (2), an ejector button (3), and a latching trigger (4). An ejector handle spring (a hinge spring) (5) and ejector handle hinge pin (6) are used to secure the ejector handle (2) to the housing block (1). An ejector button screw (7) and ejector button spring (a linear spring) (10) are used to secure the ejector button (3) to the housing block (1). Finally, a trigger latch spring (a hinge spring) (9) and a trigger latch hinge pin (8) are used to secure the trigger latch (4) to the housing block (1).

Figure 2:
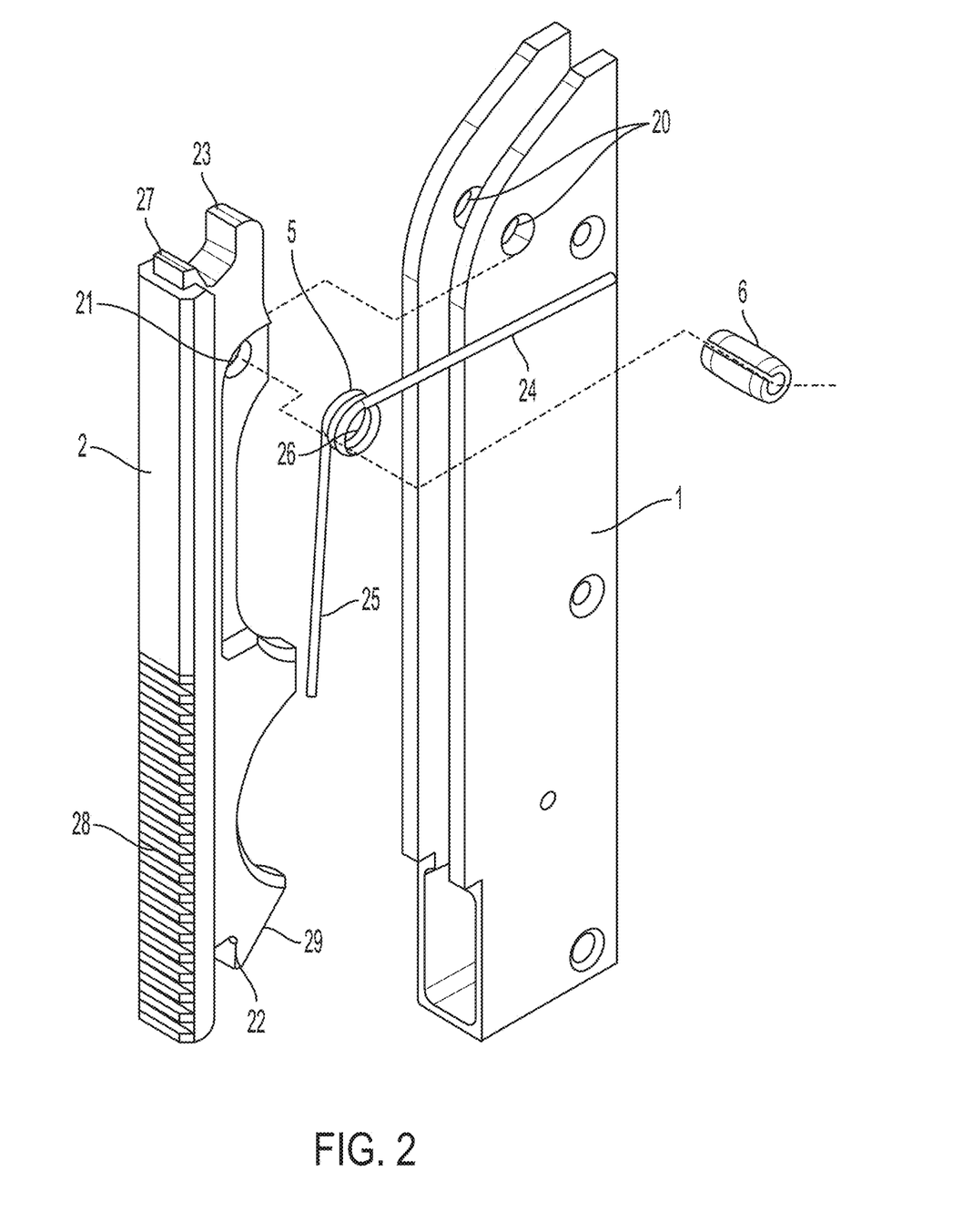
FIG. 2 shows a partial orthogonal exploded view of the ejector device of the present invention illustrating the manner of attachment of the ejector handle to the housing block.

FIG. 2 shows how the ejector handle (2) and housing block (1) are assembled. The ejector handle (2) has a front portion (28) adapted to be urged in the direction of housing block (1) by pressure from an operator, and a handle pivot opening (21), which corresponds to one or more handle pivot holes (20) on housing block (1) when the ejector handle (2) is inserted inside the housing block (1). Ejector handle spring (5) is located on ejector handle (2) so that its pivot point (26) is aligned with handle pivot opening (21) and handle pivot holes (20). The two arms (25, 24) of spring (5) respectively abut the ejector handle (2) and housing block (1) so as to bias the ejector handle (2) to the open position with respect to housing block (1) once assembled. Ejector handle hinge pin (6) is inserted through handle pivot opening (21), handle pivot holes (20), and spring pivot point (26) to complete the engagement. As shown, ejector handle (2) can optionally include friction ribs in its exterior to provide additional grip support and can include interior anatomical gripping features. To provide additional strength, ejector handle (2) can have a "T" or "I" shaped cross section.

Figure 3:
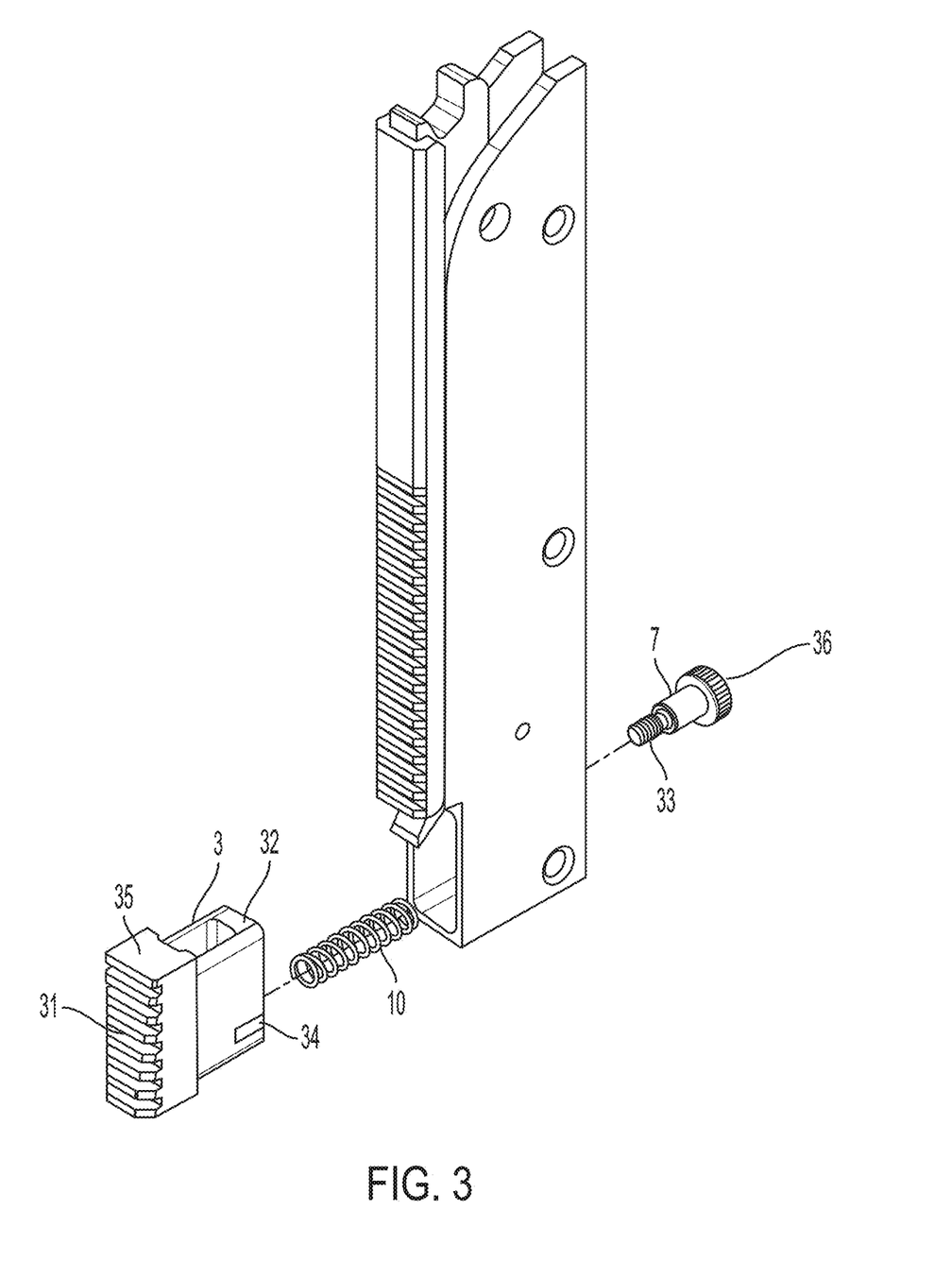
FIG. 3 shows a partial orthogonal exploded view of the ejector device of the present invention illustrating the manner of attachment of the ejector button to the housing block.

FIG. 3 shows how the ejector button (2) and housing block (1) are assembled. The ejector button (3) has a front portion (31) adapted to be urged in the direction of housing block (1) by pressure from an operator, a rear portion (32) with a threaded opening (34), and a trigger latch impingement (35) adapted to abut with latching trigger (4) portion (see e.g., FIGS. 1, 4, 6.) The ejector button screw (7) has an externally threaded shaft (33) with threads that correspond to the threads of threaded opening (34), and a knurled back which is adapted to be turned in order to loosen or tighten the ejector button screw (7) with respect to the ejector button (3). The ejector button (3) is secured by inserting it into the lower end of the housing block (1), inserting the ejector button screw (7) through an opening on the housing (see FIG. 6) which corresponds with threaded opening (34), placing ejector button spring (10) over the shaft of ejector button screw (7) (not shown), or between the rear of ejector button (3) and housing block (1), and screwing in threaded shaft (33) into the threaded opening (34) until tight. The ejector button spring (10) thus biases the ejector button (3) outwards with respect to the housing block (1) once assembled. It will be observed that the tighter ejector button screw (7) is turned, the greater the bias of the ejector button spring (10).

Figure 4:
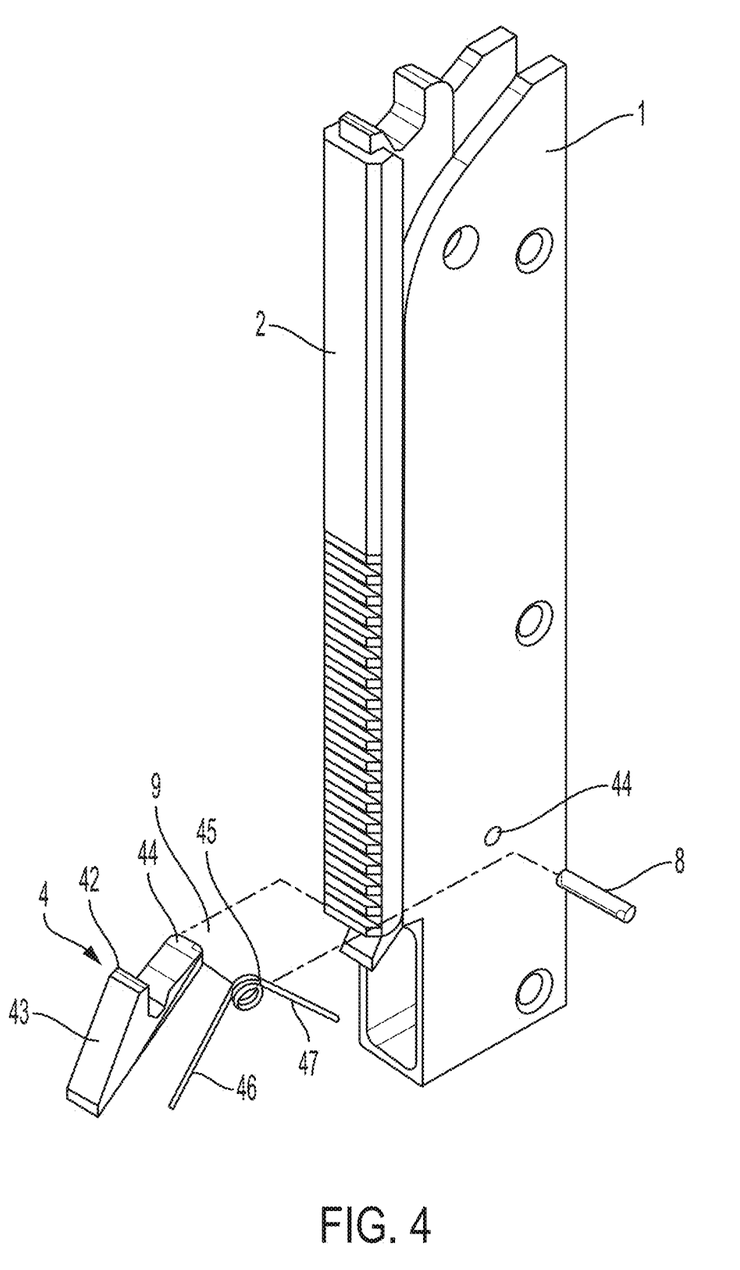
FIG. 4 shows a partial orthogonal exploded view of the ejector device of the present invention illustrating the manner of attachment of the latching trigger to the housing block.

FIG. 4 shows how the latching trigger (4) and housing block (1) are assembled. Latching trigger (2) has a front portion with a sloped surface (43) terminating in a handle engagement hook (42). The handle engagement hook (42) is adapted to engage a notch (FIG. 2, 22) on ejector handle (2) when the latching trigger (2) is pivoted upwards, and to disengage the notch (22) when the latching trigger (2) is pivoted downwards. Latching trigger (4) has a rear portion with a latch pivot opening (44) which corresponds to one or more latch pivot holes (41) on housing block (1) when the latching trigger (4) is inserted inside the housing block (1). Ejector handle spring (9) is located on latching trigger (4) so that its pivot point (45) is aligned with latch pivot opening (44) and latch pivot holes (41). The two arms (47, 46) of spring (9) respectively abut the latching trigger (4) and housing block (1) so as to bias the latching trigger (4) to the upward pivot position with respect to housing block (1) once assembled. Trigger latch hinge pin (8) is inserted through latch pivot opening (44), latch pivot holes (41), and spring pivot point (45) to complete the engagement.

Figure 5:
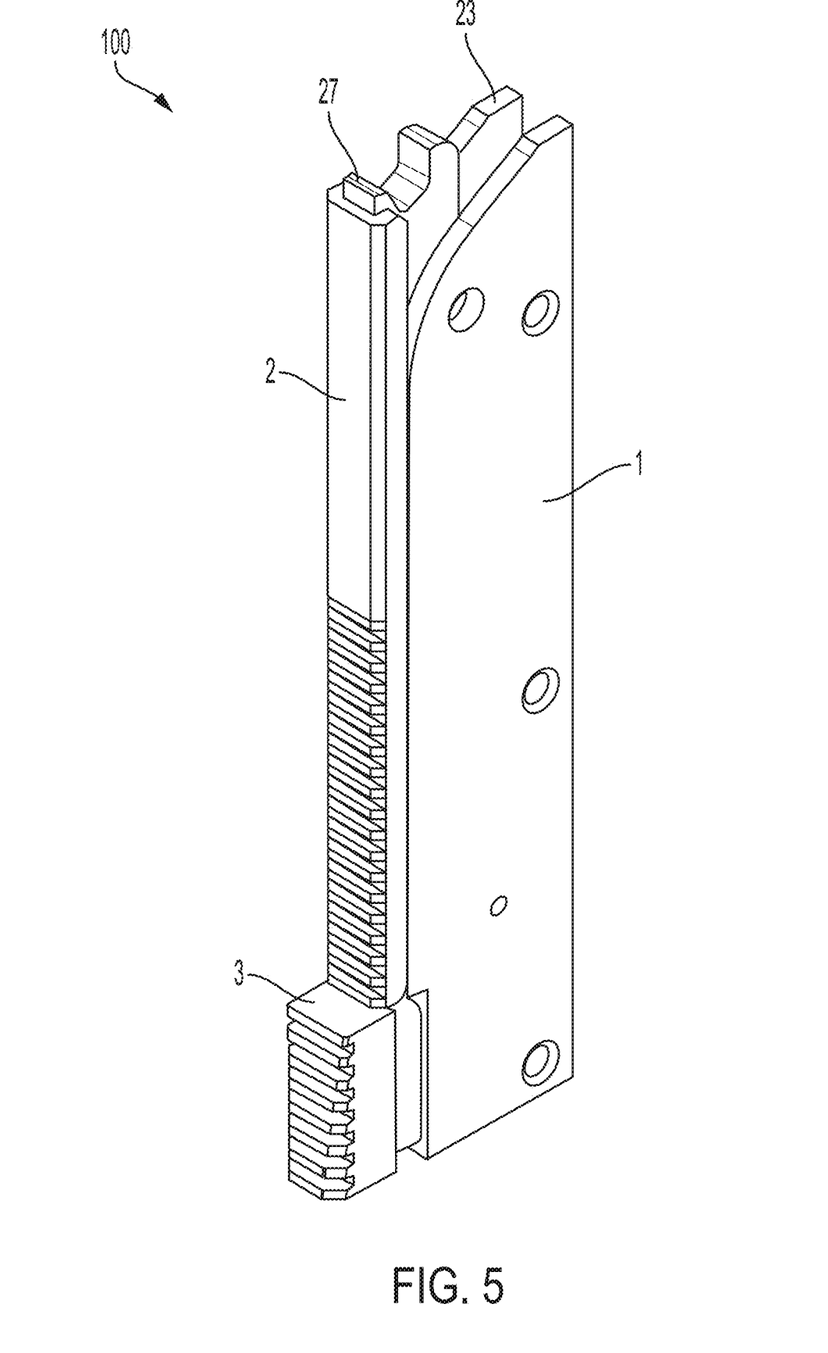
FIG. 5 shows an orthogonal view of the ejector device of the present invention in the fully assembled closed position.
Figure 6:
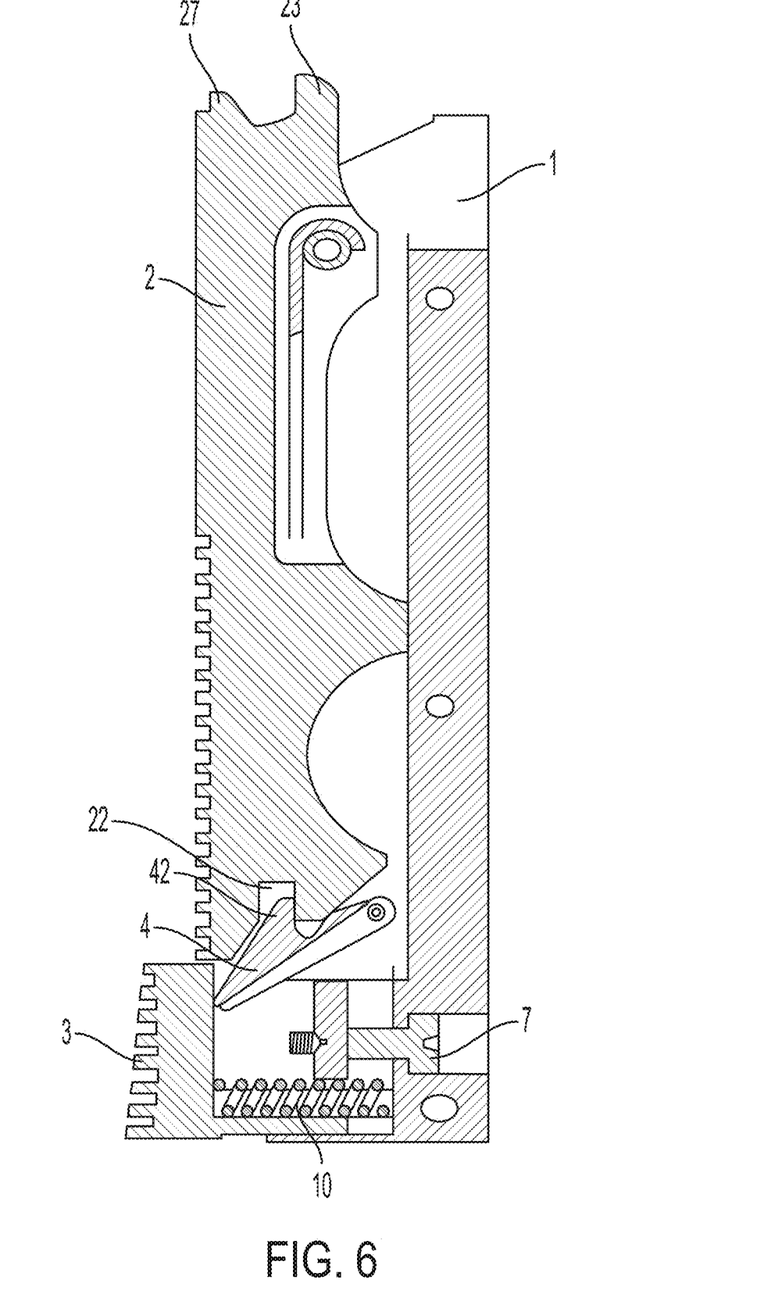
FIG. 6 shows a cross-sectional view of the ejector device of the present invention in the fully assembled closed position.

Referring next to FIGS. 5 and 6, shown are fully assembled orthogonal and cross-sectional views of the ejector device (100) in the closed position. It will be observed that in this position, the ejector handle (2), although biased to the open position by ejector handle spring (5), is held in the closed position by the engagement of notch (22) by hook (42) on latching trigger (4), which is itself biased in the upward pivot position by spring (9). As ejector button (3) is pushed in, and its rear portion (32) impinges on the sloped portion (43) of latching trigger (4), latching trigger (4) is pivoted down until notch (22) and hook (42) disengage. Ejector handle spring (5) then urges ejector handle (2) to pivot to the open position and the ejector button (3) can be released, returning the latching trigger (4) to its original position To close the ejector device, the operator applies pressure to front portion (28) of handle (2). A sloped portion (29) on handle (2) urges latching trigger (4) to pivot down until notch (22) and hook (42) engage, locking the handle in the closed position until the next opening cycle.

Figure 7:
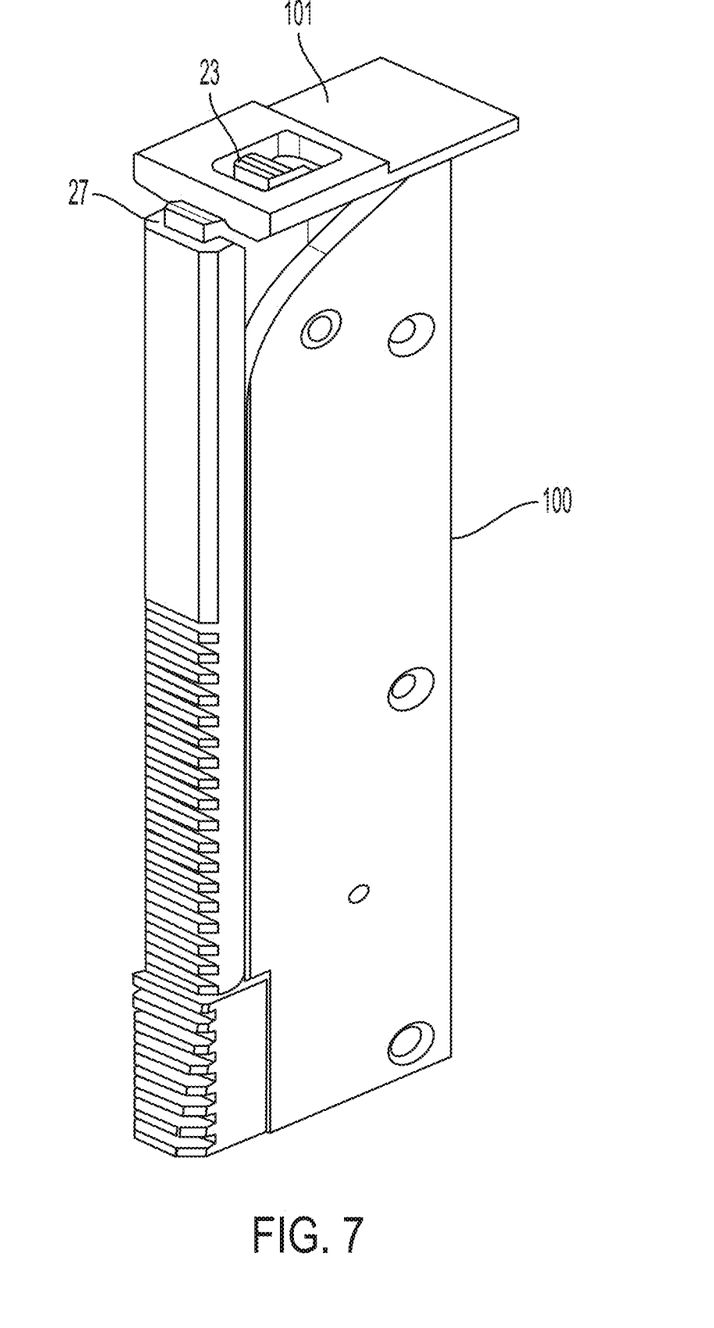
FIG. 7 shows an orthogonal view of the ejector device in the closed position in engagement with a rack component.
Figure 8:
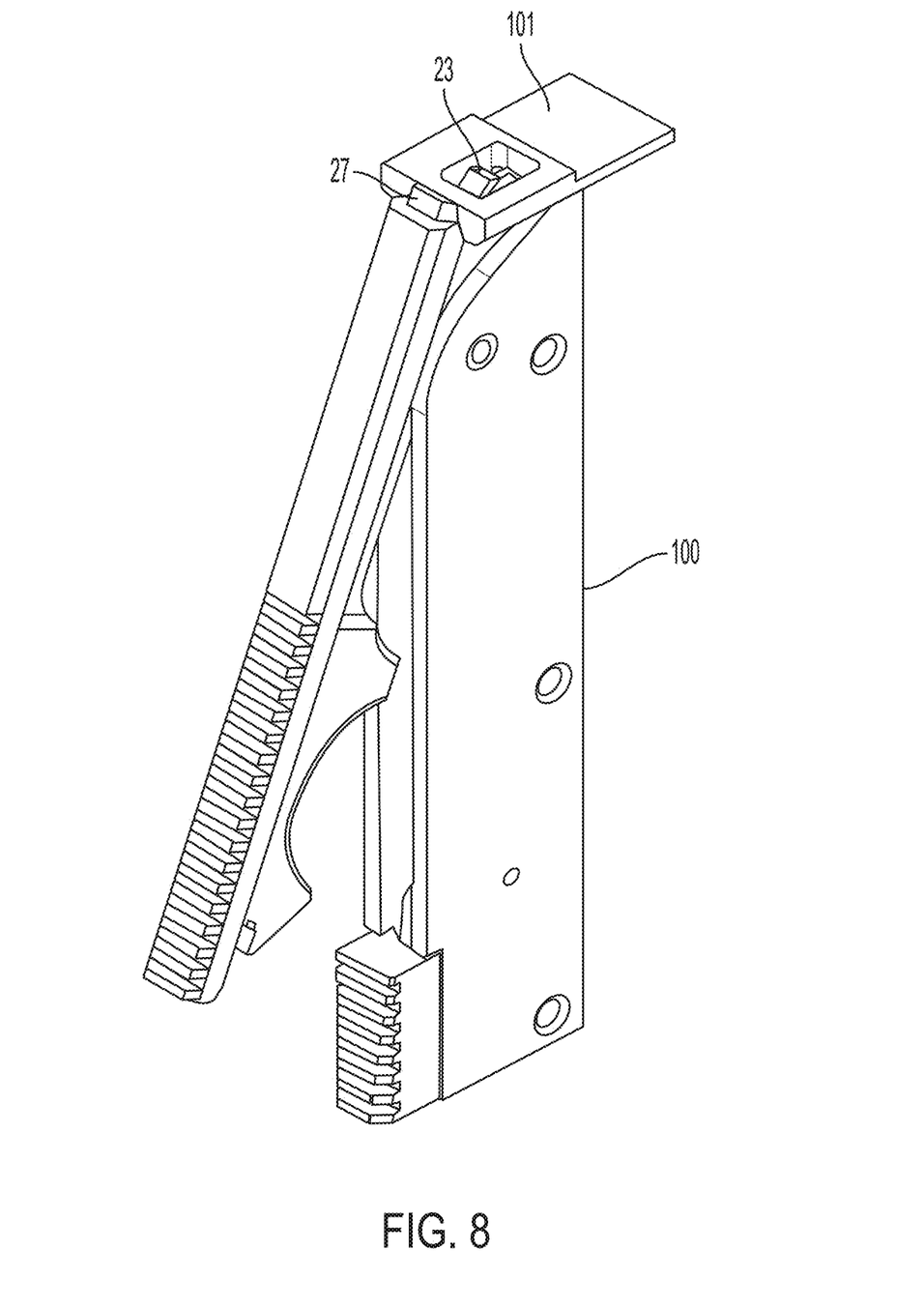
FIG. 8 shows an orthogonal view of the ejector device in the open position in engagement with a rack component.

It will be observed from FIG. 2 that ejector handle (2) has rack disengagement (27) and rack engagement (23) features that pivot with the ejector handle (2). The rack disengagement feature (27) is adapted to generate a force that assists in ejecting the ejector device (100), and any equipment attached to it, away from a rack when the ejector handle (2) is opened (i.e., pivoted upwards). Correspondingly, the rack engagement feature (23) is adapted to generate a force that assists in inserting the ejector device (100), and any equipment attached to it, into a rack when the ejector handle (2) is closed (i.e., pivoted downwards.) FIGS. 7 and 8, respectively show the ejector device (100) in the closed and open positions engaged with a rack component (101) adapted to engage with the rack disengagement (27) and rack engagement (23) features.

Although described above in connection with particular hardware configurations and standards, these descriptions are not intended to be limiting as various modifications may be made therein without departing from the spirit of the invention and within the scope and range of equivalent of the described embodiments. Encompassed embodiments of the present invention can be used in all applications where equipment of any nature needs to be inserted and removed from an equipment rack, shelf, or similar structure, using a compact, lightweight, rugged, and easily manufactured ejector device.

I claim:

1. An ejector device comprising:
    a housing block;
    an ejector handle adapted to alternate between an open position and a closed position, the ejector handle having first and second rack engagement features, a sloped handle feature, and a notch;
    a trigger latch adapted to alternate between a latched position and an unlatched position, the trigger latch having a sloped trigger latch feature adapted to engage the sloped handle feature, and a hook, the hook adapted to engage the ejector handle notch; and
    an ejector button adapted to alternate between a pressed position and an unpressed position;
    wherein the housing block comprises an internal space for receiving the ejector handle and the latching trigger;
    wherein the ejector handle is pivotally attached to the housing block and is adapted to urge the latching trigger to the unlatched position when the ejector handle moves to the closed position and the sloped handle feature engages with the sloped latching trigger feature; and
    wherein the latching trigger is pivotally attached to the housing block and is adapted to be urged to the unlatched position when the ejector button moves to the pressed position and impinges on the latching trigger.

2. The ejector device of claim 1 further comprising:
    an ejector handle spring adapted to bias the ejector handle to the open position;
    a trigger latch spring adapted to bias the trigger latch to the latched position; and
    an ejector button spring adapted to bias the ejector button to the unpressed position.

3. The ejector device of claim 2, further comprising:
    a rack disengagement feature on the ejector handle adapted to exert a force to disengage the ejector device from a rack when the ejector handle is moved to the open position; and
    a rack engagement feature on the ejector handle adapted to exert a force to disengage the ejector device from a rack when the ejector handle is moved to the closed position.

* * * * *